United States Patent
Doi et al.

(10) Patent No.: US 6,720,761 B1
(45) Date of Patent: Apr. 13, 2004

(54) HALL DEVICE BIASING CIRCUIT AND MAGNETISM DETECTION CIRCUIT INCLUDING THE SAME

(75) Inventors: Hiroki Doi, Tenri (JP); Masanori Inamori, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 233 days.

(21) Appl. No.: 09/696,006

(22) Filed: Oct. 26, 2000

(30) Foreign Application Priority Data

Jan. 25, 2000 (JP) ........................................ 2000-016349

(51) Int. Cl.[7] ........................... G01B 7/14; G01R 33/06; H03K 17/90

(52) U.S. Cl. ..................... 324/207.2; 327/511; 324/251; 324/252

(58) Field of Search ................................ 324/117, 127, 324/251, 207.2, 252; 257/426, 427; 327/511

(56) References Cited

U.S. PATENT DOCUMENTS

| | | | | | |
|---|---|---|---|---|---|
| 4,093,917 | A | * | 6/1978 | Haeussermann | 324/173 |
| 4,833,406 | A | * | 5/1989 | Foster | 324/225 |
| 5,473,250 | A | * | 12/1995 | Dillman | 324/251 |
| 5,760,581 | A | * | 6/1998 | Kalb, Jr. | 324/252 |

FOREIGN PATENT DOCUMENTS

JP           965682        3/1997

* cited by examiner

*Primary Examiner*—N. Le
*Assistant Examiner*—Donald M Lair
(74) *Attorney, Agent, or Firm*—Birch, Stewart, Kolasch & Birch, LLP

(57) ABSTRACT

A Hall device biasing circuit includes a plurality of terminals for applying a bias voltage to a plurality of Hall devices connected in series, respectively. A magnetism detection circuit includes a plurality of Hall devices connected in series; and a Hall device biasing circuit including at least a plurality of terminals corresponding to the plurality of Hall devices for supplying a constant bias voltage to each of the plurality of Hall devices respectively from the plurality of terminals.

20 Claims, 7 Drawing Sheets

HALL DEVICE BIASING CIRCUIT AND MAGNETISM DETECTION CIRCUIT INCLUDING THE SAME

BACKGROUND OF THE INVENTION

1. Field of the Invention

The present invention relates to a Hall device biasing circuit for applying a bias voltage to each of at least two Hall devices, and a magnetism detection circuit including the same.

2. Description of the Related Art

A Hall device is used for magnetism detection in a wide range of fields including motor driving circuits, pickup control of optical disks and the like, focusing control of cameras, and TPS mounted on automobiles and the like.

FIG. 6 shows an operating principle of a Hall device. When a magnetic field having magnetic flux density B is applied to a Hall device 41, the Hall device 41 outputs a voltage $V_H$ in proportion to the applied magnetic flux density B.

Systems for driving a plurality of Hall devices are classified into a constant current driving system for supplying a constant current to drive the Hall devices (in which the Hall devices are connected in series) and a constant voltage driving system for applying a constant voltage to drive the Hall devices (in which the Hall devices are connected in parallel).

FIG. 7 shows a practical example of a constant voltage driving system for driving a plurality of Hall devices 41a through 41c connected in parallel. FIG. 8 shows a practical example of a constant current driving system for driving a plurality of Hall devices 41a through 41c connected in series.

The constant voltage driving system shown in FIG. 7 operates in the following manner. A constant voltage is applied to each of the Hall devices 41a, 41b, and 41c connected in parallel from a constant voltage source 42. Then, signal output terminals H1+ and H1− of the Hall device 41a, signal output terminals H2+ and H2− the Hall device 41b, and signal output terminals H3+ and H3− of the Hall device 41c each output a voltage in proportion to a magnetic flux density applied to each of the Hall devices 41a, 41b and 41c.

According to this system, the Hall devices 41a, 41b and 41c are each driven at a constant voltage.

The constant current driving system shown in FIG. 8 for driving the Hall devices 41a, 41b, and 41c connected in series is disclosed in, for example, Japanese Laid-Open Publication No. 9-65682. A voltage from a motor driving circuit 43 is applied to the Hall devices 41a, 41b, and 41c, and the Hall devices 41a through 41c are each driven by a constant current. Accordingly, even when the number of Hall devices is increased or decreased, the driving current of the entire driving circuit does not change much.

An output voltage $V_H$ of the Hall device driven by the constant current driving system is represented by expression (1), and an output voltage $V_H$ of the Hall device driven by the constant voltage driving system is represented by expression (2).

$$V_H = (RH/d) \cdot Ic \cdot B \quad (1)$$

$$V_H = \mu H \cdot (W/L) \cdot Vin \cdot B \quad (2)$$

In the expressions (1) and (2), B represents the magnetic flux density applied to the Hall device, d represents the thickness of a magnetic field sensing portion in the Hall device (thickness of the Hall device), and W and L respectively represent the width and length of the magnetic field sensing portion in the Hall device with respect to the driving voltage. Ic represents a driving current in the constant current driving system, and Vin is a driving voltage in the constant voltage driving system. In expression (1), RH represents a Hall coefficient of the Hall device and is represented by RH=1/(e·n), where e is a charge amount of electrons, and n is a carrier concentration of the Hall device. In expression (2), $\mu H$ is an electron mobility of a semiconductor in the Hall device.

It is now assumed that the magnetic flux density B is constant and the size of the magnetic field sensing portion of the Hall device is constant. By the constant current driving system, since the driving current Ic is constant, the output voltage $V_H$ of the Hall device is in proportion to the Hall coefficient RH based on expression (1). By the constant voltage driving system, since the driving voltage Vin is constant, the output voltage $V_H$ of the Hall device is in proportion to the electron mobility $\mu H$ based on expression (2). Generally, it is known that the Hall coefficient RH is high in temperature dependency and that the electron mobility $\mu H$ is low in temperature dependency.

The constant voltage driving system shown in FIG. 7 provides better temperature characteristics than the constant current driving system, and thus the Hall devices 41a through 41c in FIG. 7 each output a voltage which is stable against a change in the ambient temperature. However, the constant voltage driving system requires a driving current in proportion to the number of Hall devices used, and thus has a disadvantage in that when a great number of Hall devices are used, the current consumption cannot be suppressed. This can be a very serious problem in a circuit having an especially large number of Hall devices due to the significant increase in the current consumption.

By the constant current driving system shown in FIG. 8, a driving current provided by the motor driving circuit 43 as a power source is used sequentially for the Hall devices 41a through 41c which are connected in series. Accordingly, even when the number of Hall devices is increased, the amount of the driving current passing through the Hall devices is not increased. However, in such a case, the problem that the temperature dependency is raised as described above.

SUMMARY OF THE INVENTION

According to one aspect of the invention, a Hall device biasing circuit includes a plurality of terminals for applying a bias voltage to a plurality of Hall devices connected in series, respectively.

In one embodiment of the invention, the Hall device biasing circuit further includes a constant voltage supply section for supplying a constant bias voltage to each of the plurality of terminals.

In one embodiment of the invention, the constant voltage supply section includes a constant voltage supply circuit in correspondence to the plurality of Hall devices.

In one embodiment of the invention, the constant voltage supply section includes: a constant voltage supply circuit, at least one current path through which a bias correction current flows from one of the plurality of terminals to another of the plurality of terminals, and a correction current supply section for selecting one of the at least one current path based on a current amount therein and adjusting the current amount in the selected current path to supply the bias correction current.

In one embodiment of the invention, the correction current supply section includes: a constant voltage generation circuit, and a comparison section connected to the at least one current path for selecting one of the at least one current path based on a current amount therein and adjusting the current amount in the selected current path based on a current amount flowing through the at least one current path and a current amount generated in the constant voltage generation circuit.

In one embodiment of the invention, the constant voltage supply section uses a supply voltage outside the Hall device biasing circuit.

In one embodiment of the invention, the constant voltage supply section includes: at least one current path through which a bias correction current flows from one of the plurality of terminals to another of the plurality of terminals, and a correction current supply section for selecting one of the at least one current path based on a current amount therein and adjusting the current amount in the selected current path to supply the bias correction current.

In one embodiment of the invention, the correction current supply section includes: a reference voltage source, and a comparison section connected to the at least one current path for selecting one of the at least one current path based on a current amount therein and adjusting the current amount in the selected current path based on a current amount flowing through one of the plurality of terminals and a current amount generated in the reference voltage source.

In one embodiment of the invention, the comparison section includes a comparator circuit.

In one embodiment of the invention, a positive terminal of the comparator circuit is connected to a terminal of one of the plurality of terminals, and the negative terminal of the comparator circuit is supplied with a reference voltage generated in the reference voltage source.

In one embodiment of the invention, the comparator circuit includes a buffer amplifier.

In one embodiment of the invention, the at least one current path includes a switching device.

In one embodiment of the invention, the at least one current path includes an OR circuit and an inverter.

In one embodiment of the invention, the correction current supply section includes: a plurality of reference voltage sources respectively provided in correspondence to the plurality of Hall devices, and a plurality of comparison sections each connected to each of the at least one current path for selecting one of the at least one current path based on a current amount therein and adjusting the current amount in the selected current path based on a current amount flowing through one of the plurality of terminals and a current amount generated in one of the plurality of reference voltage sources corresponding to the one of the plurality of terminals.

In one embodiment of the invention, the correction current supply section further includes a resistor between the reference voltage source and the comparison section for dividing a resistance of the reference voltage source.

In one embodiment of the invention, a former-stage terminal with respect to one of the plurality of terminals corresponding to the buffer amplifier is connected to a positive power supply of the buffer amplifier, and a latter-stage terminal with respect to the one of the plurality of terminals corresponding to the buffer amplifier is connected to a negative power supply of the buffer amplifier.

According to another aspect of the invention, a magnetism detection circuit includes a plurality of Hall devices connected in series; and a Hall device biasing circuit including at least a plurality of terminals corresponding to the plurality of Hall devices for supplying a constant bias voltage to each of the plurality of Hall devices respectively from the plurality of terminals.

In one embodiment of the invention, the Hall device biasing circuit further includes a constant voltage supply section.

In one embodiment of the invention, one end of the series of plurality of Hall devices is grounded.

Thus, the invention described herein makes possible the advantages of providing a Hall device biasing circuit for driving each of a plurality of Hall devices so as to maintain the satisfactory temperature dependency without increasing the driving current even when the number of Hall devices is increased, and a magnetism detection circuit including such a Hall device biasing circuit.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

EXAMPLE 1

Figure 1:
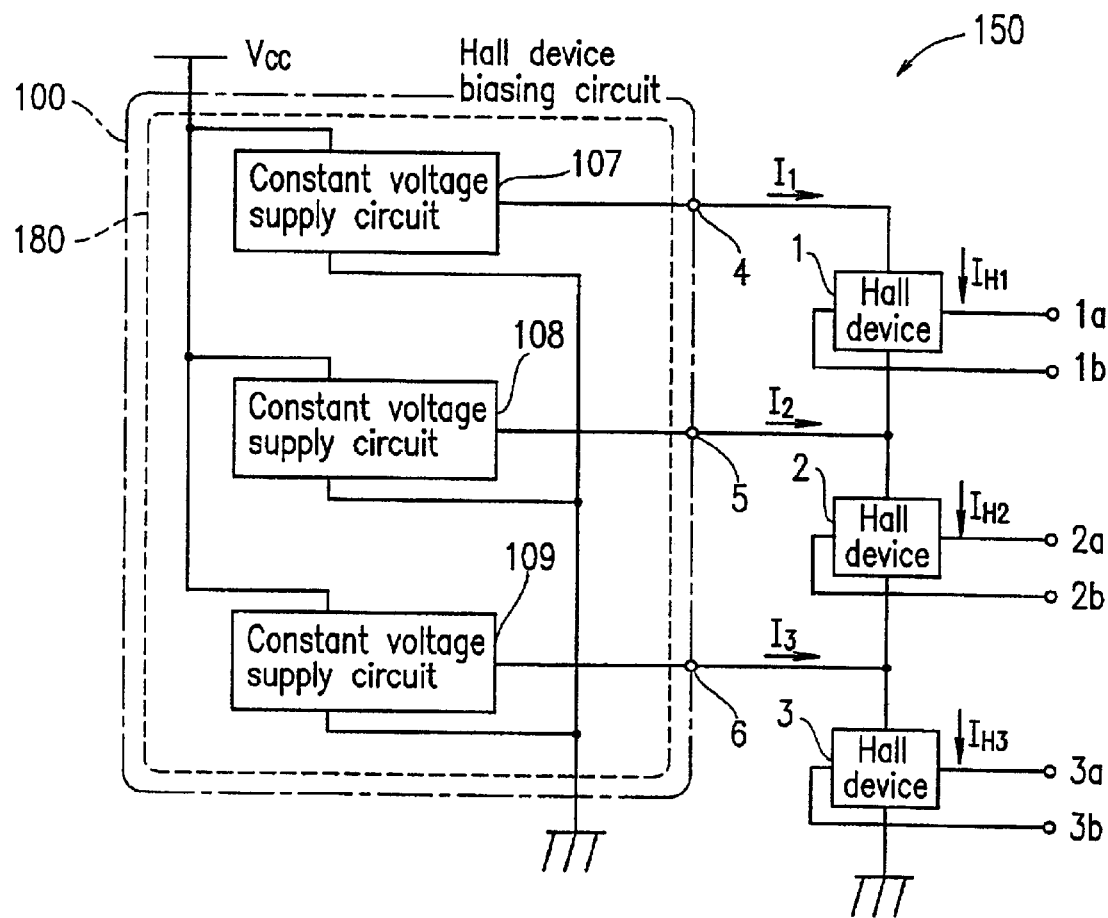
FIG. 1 is a block diagram illustrating a Hall device biasing circuit in one example according to the present invention.

FIG. 1 is a block diagram of a Hall device biasing circuit 100 and a magnetism detection circuit 150 in a first example according to the present invention. The magnetism detection circuit 150 includes the Hall device biasing circuit 100, a first Hall device 1, a second Hall device 2 and a third Hall device 3. The first Hall device 1, the second Hall device 2 and the third Hall device 3 are connected in series.

The Hall device biasing circuit 100 includes a constant voltage supply section 180 for applying a bias voltage to each of the Hall devices 1 through 3. One end of the third Hall device 3 is grounded. The Hall device biasing circuit 100 further includes a first terminal 4, a second terminal 5 and a third terminal 6 all for applying a bias voltage. In this specification, a terminal which is closer to the first terminal 4, namely, closer to a supply voltage $V_{CC}$, than a particular terminal will be referred to as the "former-stage terminal" with respect to the particular terminal. The "former-stage terminal" is not limited to a terminal which is immediately before the particular terminal. A terminal which is farther from the first terminal 4 than the particular terminal will be referred to as the "latter-stage terminal" with respect to the particular terminal. The "latter-stage terminal" is not limited to a terminal which is immediately after the particular terminal. In the first example, the first terminal 4 is a "former-stage terminal" with respect to the second terminal 5, and the third terminal 6 is a "latter-stage terminal" with respect to the second terminal 5.

The first terminal 4 is connected to the first Hall device 1, the second terminal 5 is connected to a connection point between the first Hall device 1 and the second Hall device 2, and the third terminal 6 is connected to a connection point between the second Hall device 2 and the third Hall device 3. The Hall device 1 has signal output terminals 1a and 1b. The Hall device 2 has signal output terminals 2a and 2b. The Hall device 3 has signal output terminals 3a and 3b. A current which is in proportion to the magnetic flux density applied to each of the Hall devices 1, 2 and 3 is output from the corresponding signal output terminal (terminals 1a and 1b, 2a and 2b, 3a and 3b).

The constant voltage supply section 180 includes a first constant voltage supply circuit 107, a second constant voltage supply circuit 108, and a third constant voltage supply circuit 109, which are each supplied with a prescribed supply voltage $V_{cc}$. The supply voltage $V_{cc}$ is located outside the Hall device biasing circuit 100 in FIG. 1, but can be included in the Hall device biasing circuit 100. The supply voltage $V_{cc}$ is connected to each of the first constant voltage supply circuit 107, the second constant voltage supply circuit 108, and the third constant voltage supply circuit 109. The first constant voltage supply circuit 107, the second constant voltage supply circuit 108, and the third constant voltage supply circuit 109 a reach grounded. The first constant voltage supply circuit 107, the second constant voltage supply circuit 108, and the third constant voltage supply circuit 109 output currents $I_1$, $I_2$ and $I_3$ through the first terminal 4, the second terminal 5 and the third terminal 6, respectively, so as to apply a constant voltage to the first Hall device 1, the second Hall device 2, and the third Hall device 3, respectively. In the first example, since the current is shared by the first through third Hall devices 1 through 3 by connecting the first through third Hall devices 1 through 3 in series, the current consumption is suppressed. Therefore, a voltage of the first terminal 4 is set to be lower than the supply voltage $V_{cc}$ by the first constant voltage supply circuit 107, a voltage of the second terminal 5 is set to be lower than the voltage of the first terminal 4 by the second constant voltage supply circuit 108, and a voltage of the third terminal 6 is set to be lower than the voltage of the second terminal 5 by the third constant voltage supply circuit 109.

The current $I_1$ output from the first terminal 4 is supplied to a bias application terminal of the first Hall device 1, a current $I_2$ output from the second terminal 5 is supplied to a bias application terminal of the second Hall device 2, and a current $I_3$ output from the third terminal 6 is supplied to a bias application terminal of the third Hall device 3. Due to this structure, the first through third Hall devices 1 through 3 are provided with constant bias voltages supplied from the first through third constant voltage supply circuits 107, 108 and 109, respectively.

As described above, the first through third Hall devices 1 through 3 are each supplied with a constant voltage. Thus, the output voltages $V_H$ of the first through third Hall devices 1 through 3 are represented by expression (2) by the constant voltage driving system set forth above.

$$V_H = \mu H \cdot (W/L) \cdot Vin \cdot B \qquad (2)$$

According to the structure of the first example, the output voltage $V_H$ is in proportion to the electron mobility $\mu H$ having a low temperature dependency despite that the first through third Hall devices 1 through 3 are connected in series. Thus, the first through third Hall devices 1 through 3 provide output voltages which are stable against a temperature change. In other words, the Hall devices 1 through 3 operate with satisfactory temperature characteristics.

EXAMPLE 2

Figure 2:
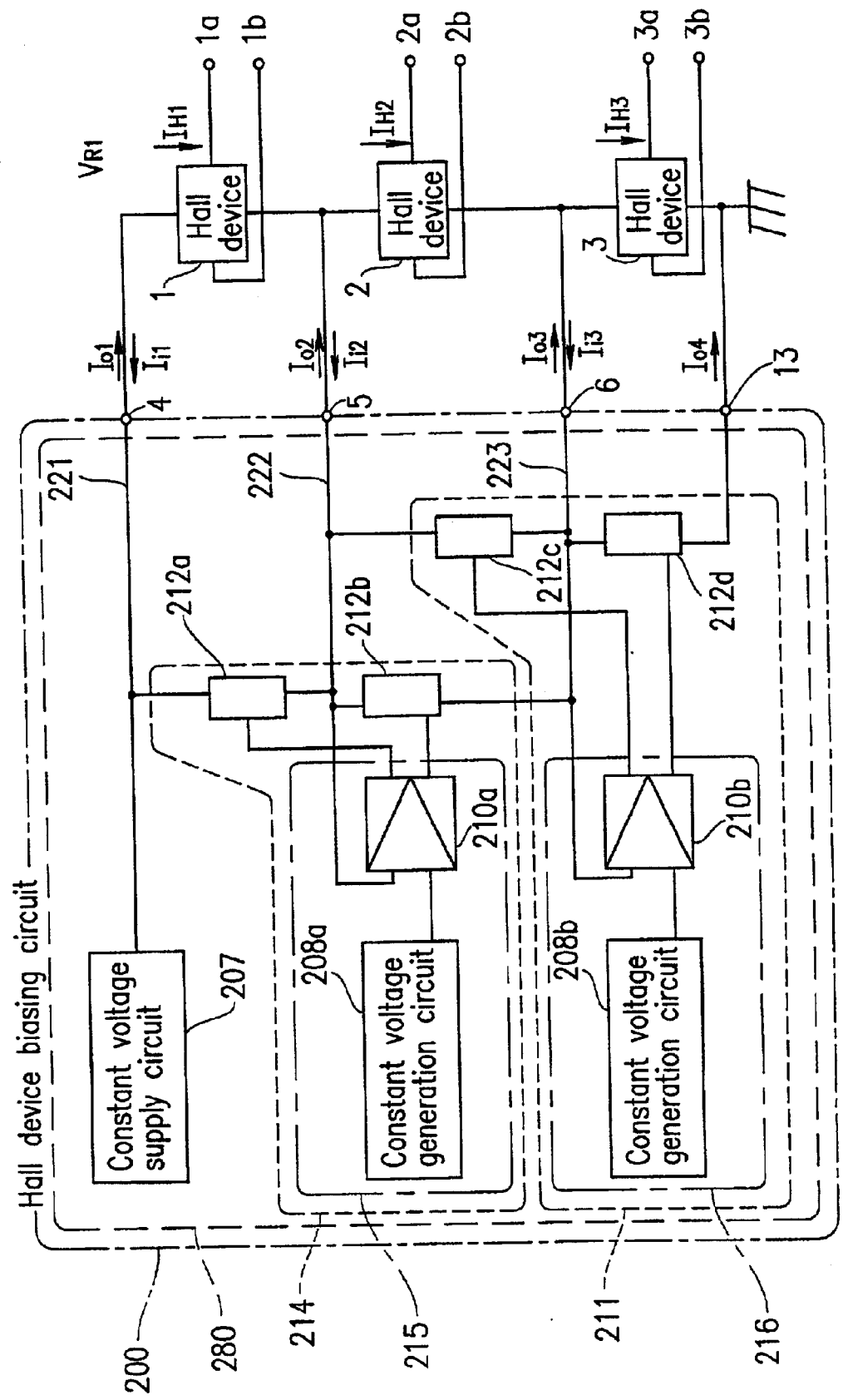
FIG. 2 is a block diagram illustrating a Hall device biasing circuit in another example according to the present invention.

FIG. 2 is a block diagram of a Hall device biasing circuit 200 and a magnetism detection circuit 250 in a second example according to the present invention. The magnetism detection circuit 250 includes the Hall device biasing circuit 200, a first Hall device 1, a second Hall device 2 and a third Hall device 3. The first Hall device 1, the second Hall device 2 and the third Hall device 3 are connected in series.

The Hall device biasing circuit 200 includes a constant voltage supply section 280. The constant voltage supply section 280 includes a constant voltage supply circuit 207, and a first correction current supply section 215 and a second correction current supply section 216 both for generating a bias correction current. The first correction current supply section 215 includes a first constant voltage generation circuit 208a for generating a prescribed constant voltage and a first comparison section 210a. The second correction current supply section 216 includes a first constant voltage generation circuit 208b for generating a prescribed constant voltage and a second comparison section 210b. In the second example, a comparator circuit is used for each of the first and second comparison sections 210a and 210b. The constant voltage supply circuit 207 supplies a bias voltage to the first Hall device 1 among the three Hall devices 1 through 3 connected in series. One end of the third Hall device 3 is grounded. The Hall device biasing circuit 200 further includes a first terminal 4, a second terminal 5, a third terminal 6, and a ground terminal 13. The first terminal 4, the second terminal 5, and the third terminal 6 respectively apply a bias voltage to the Hall devices 1, 2 and 3. The ground terminal 13 is connected to the ground. The first terminal 4 is connected to the first Hall device 1, the second terminal 5 is connected to a connection point between the first Hall device 1 and the second Hall device 2, and the third terminal 6 is connected to a connection point between the second Hall device 2 and the third Hall device 3.

Currents output from the terminals 4 through 6 and 13 are referred to as $I_{o1}$ through $I_{o4}$, respectively. Currents input to the terminals 4 through 6 are referred to as $I_{i1}$ through $I_{i3}$.

The constant voltage supply circuit 207 is connected to the first terminal 4 through a line 221. The first comparison section 210a is connected to the second terminal 5 through a line 222. The second comparison section 210b is connected to the third terminal 6 through a line 223.

The first current path 212a is provided between the lines 221 and 222, and the second current path 212b is provided between the lines 222 and 223. The line 222 through which the current $I_{i2}$ input to the second terminal 5 or current $I_{o2}$ output from the second terminal 5 flows is connected to the first comparison section 210a, and the first comparison section 210a is supplied with a current generated in the first constant voltage generation circuit 208a. Based on the output from the first comparison section 210a, the first current path 212a or the second current path 212b is selected, and the amount of the current flowing in the selected current path 212a or 212b is adjusted as described in detail below.

A third current path 212c is provided between the lines 222 and 223, and a fourth current path 212d is provided between the lines 223 and the ground terminal 13. The line 223 through which the current $I_{i3}$ input to the third terminal 6 or the current $I_{o3}$ output from the third terminal 6 flows is connected to the second comparison section 210b, and the second comparison section 210b is supplied with a current generated in the second constant voltage generation circuit 208b. Based on the output from the second comparison section 210b, the third current path 212c or the fourth current path 212d is selected, and the amount of the current flowing in the selected current path 212c or 212d is adjusted as described in detail below.

The first comparison section 210a compares the current $I_{i2}$ input to the second terminal 5 or the current $I_{o2}$ output from the second terminal 5 with the current from the first constant voltage generation circuit 208a. When a driving current $I_{H2}$ for the second Hall device 2 is insufficient, the first comparison section 210a selects the first current path 212a and supplies a portion of the current which is to be supplied to the first Hall device 1 to the second Hall device 2 through the second terminal 5 as a bias correction current. When the driving current $I_{H2}$ for the second Hall device 2 is excessive, the first comparison section 210a selects the second current path 212b and supplies an excessive portion of the current which is to be supplied to the second Hall device 2 to the third Hall device 3 through the third terminal 6 as a bias correction current.

Similarly, the second comparison section 210b compares the current $I_{i3}$ input to the third terminal 6 or the current $I_{o3}$ output from the third terminal 6 with the current from the second constant voltage generation circuit 208b. When a driving current $I_{H3}$ for the third Hall device 3 is insufficient, the second comparison section 210b selects the third current path 212c and supplies a portion of the current which is to be supplied to the second Hall device 2 to the third Hall device 3 through the third terminal 6 as a bias correction current. When the driving current $I_{H3}$ for the third Hall device 3 is excessive, the second comparison section 210b selects the fourth current path 212d and supplies an excessive portion of the current which is to be supplied to the third Hall device 3 to the ground through the ground terminal 13 as a bias correction current.

In general, Hall devices have different internal resistances on an individual basis, and the internal resistances are dispersed in the range of about 1.5 times to 2 times with respect to one another.

For example, it is assumed that in the magnetism detection circuit 250 shown in FIG. 2, the internal resistances of the Hall devices 1 through 3 are dispersed, and the internal resistance of the second Hall device 2 is twice the internal resistance of each of the first and third Hall devices 1 and 3. In this case, in order to apply a voltage VR1 to the entirety of the three Hall devices 1 through 3 connected in series so that the bias voltage of each of the Hall devices 1 through 3 is VR1/3, the driving current flowing in each of the Hall devices 1 through 3 needs to have the following relationship.

$$I_{o1}=I_{H1}=2I_{H2}=I_{H3} \quad (3)$$

In other words, in order to cause each of the Hall devices 1 through 3 having the above-mentioned internal resistances to have a constant voltage, the current passing through the Hall device 2 needs to be half of the current passing through each of the Hall devices 1 and 3.

In order to cause a current $I_{H2}$ to flow in the Hall device 2, the currents input to and output from the first through third terminals 4 through 6 in the Hall device biasing circuit 200 have the following relationships.

$$I_{H1}=I_{i2}+I_{H2},$$
$$I_{H2}=I_{i2}=I_{o3}, \quad (4)$$
$$I_{H3}=I_{H2}+I_{o3}$$

A current $I^{H1}$ which has passed through the Hall device 1 is divided into a current $I_{i2}$ input to the Hall device biasing circuit 200 through the second terminal 5 and a current $I_{H2}$ passing through the second Hall device 2 (first expression of (4)). A current $I_{H3}$ passing through the Hall device 3 is represented by the sum of the current $I_{H2}$ which has passed through the second Hall device 2 and a current $I_{o3}$ output from the Hall device biasing circuit 200 through the third terminal 6 (third expression of (4)). In this case, when the current $I_{H2}$, the current $I_{i2}$ and the current $I_{o3}$ are equal to one another (second expression of (4)), the Hall devices 1 through 3 are each supplied with a constant voltage.

In order to realize this, the first comparison section 210a selects the second current path 212b and adjusts the amount of the current therein, and thus a portion of the current flowing from first Hall device 1 to the second Hall device 2 (having a larger internal resistance) is branched as a bias correction current $I_{i2}$. The bias correction current $I_{i2}$ is output from the third terminal 6 as the current $I_{o3}$ through the second current path 212b and is supplied to the third Hall device 3. As a result, the driving current for the second Hall device 2 is ½ of the driving current passing through each of the first and third Hall devices 1 and 3. Thus, the voltage of each of the first through third Hall devices 1 through 3 is VR1/3.

In FIG. 2, a bias voltage setting section 211 (corresponding to the constant voltage supply circuit 109 in FIG. 1) includes the second constant voltage generation circuit 208b, the second comparison section 210b, the third current path 212c and the fourth current path 212d. Similarly, a bias voltage setting section 214 (corresponding to the constant voltage supply circuit 108 in FIG. 1) includes the first constant voltage generation circuit 208a, the first comparison section 210a, the first current path 212a and the second current path 212b.

Due to the above-described structure, the insufficiency and excessiveness in the driving currents for the first through third Hall devices 1 through 3 are counteracted. In consequence, the driving current for the Hall device which has the smallest resistance, namely, consumes the largest amount of current among the Hall devices 1 through 3 connected in series is consumed by the entirety of the Hall devices 1 through 3. The Hall devices 1 through 3 do not require any larger amount of current. In other words, in the Hall device biasing circuit 200 and the magnetism detection circuit 250, when the Hall devices 1 through 3 having different internal resistances are each driven in the state of being connected in series, the total driving current required to drive all the Hall devices 1 through 3 is determined by the Hall devices used. Accordingly, it is not necessary to limit the order of connecting the Hall devices (locations of the Hall devices). This is also true when a different number of Hall devices are connected.

The Hall device biasing circuit 200 and the magnetism detection circuit 250 in the second example will be compared with the Hall device biasing circuit 100 (FIG. 1) and the magnetism detection circuit 150 in the first example. In the Hall device biasing circuit 100 having no current path between the output terminals (between the terminals 4 and 5 and between the terminals 5 and 6), when the current flowing from the first Hall device 1 to the second Hall device 2 is excessive, the excessive portion of the current $I_2$ (corresponding to $I_{i2}$ in FIG. 2; in this case, $I_2$ has a negative value) is input to the Hall device biasing circuit 100 through the second terminal 5 and then expelled to the ground through the constant voltage supply circuit 108. When the current $I_3$ for the third Hall device 3 (corresponding to $I_{o3}$ in FIG. 2) is insufficient, the insufficient portion of the current is supplied from the supply voltage $V_{CC}$ through the constant voltage supply circuit 109.

Accordingly, in the case where the Hall device biasing circuit 100 includes the constant voltage supply circuits 107 through 109 independent from one another as shown in FIG. 1, driving of the Hall devices 1 through 3 requires a current supplied from the supply voltage $V_{CC}$ to the third terminal 6 in addition to the driving current $I_1$ from the constant voltage supply circuit 107. As a result, the total driving current for the Hall devices 1 through 3 may be about 1.5 times the total current required to drive the Hall devices 1 through 3 by the Hall device biasing circuit 200 shown in FIG. 2.

In the structure shown in FIG. 1 where current paths are not provided for connecting the terminals 4 and 5 or for connecting the terminals 5 and 6, a current other than the driving current $I_1$ for the Hall device may be consumed. In the structure shown in FIG. 2, the Hall device biasing circuit 200 does not require such an additional current and thus the current consumption can be reduced.

EXAMPLE 3

Figure 3:
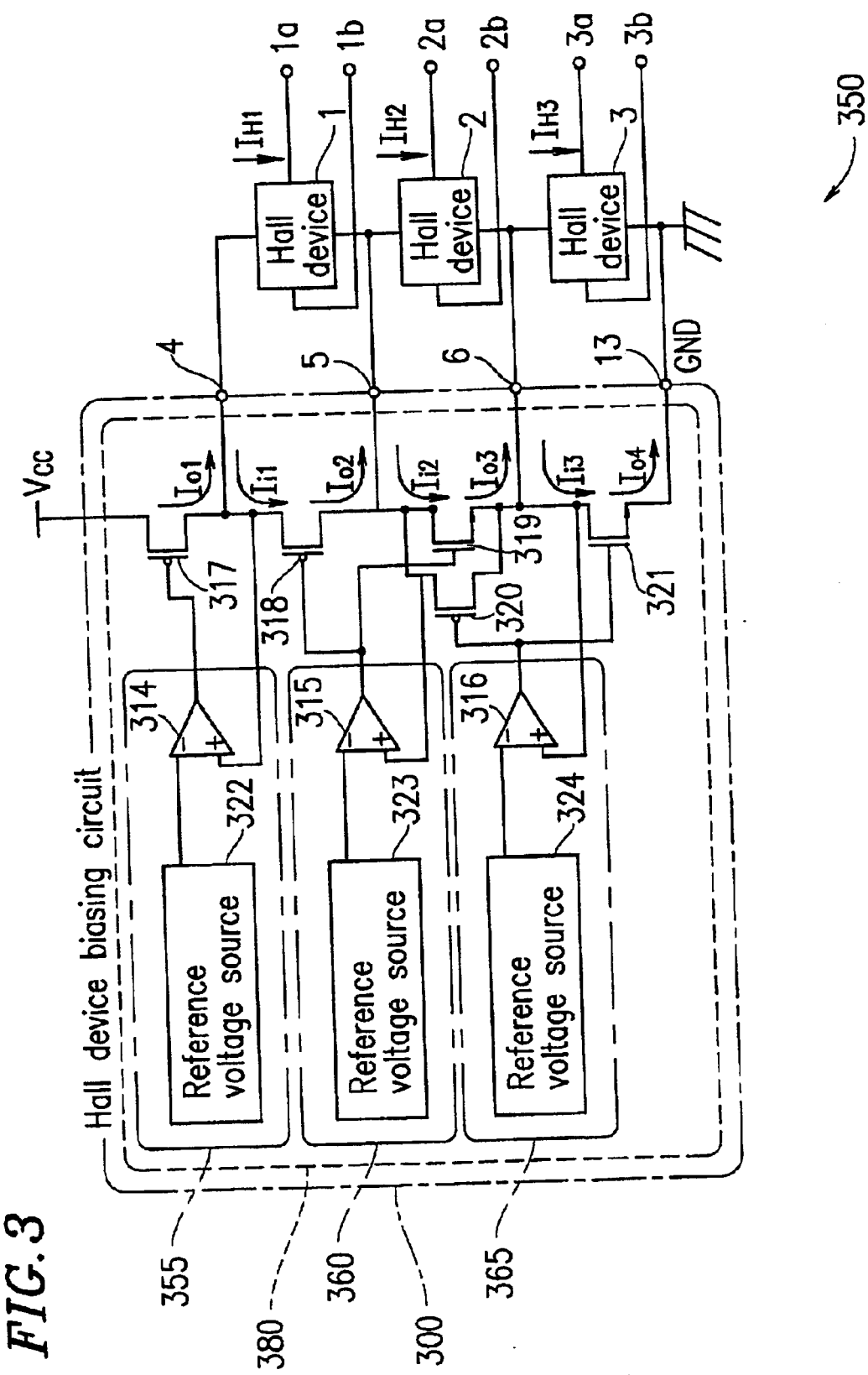
FIG. 3 is a block diagram illustrating a Hall device biasing circuit in still another example according to the present invention.

FIG. 3 is a block diagram of a Hall device biasing circuit 300 and a magnetism detection circuit 350 in a third example according to the present invention. The magnetism detection circuit 350 includes the Hall device biasing circuit 300, a first Hall device 1, a second Hall device 2 and a third Hall device 3. The first Hall device 1, the second Hall device 2 and the third Hall device 3 are connected in series. As in the second example, the Hall device biasing circuit 300 applies a constant bias voltage to each of the Hall devices 1 through 3.

The Hall device biasing circuit 300 includes a first terminal 4, a second terminal 5, a third terminal 6, and a ground terminal 13. The first terminal 4 is connected to the first Hall device 1, the second terminal 5 is connected to a connection point between the first Hall device 1 and the second Hall device 2, and the third terminal 6 is connected to a connection point between the second Hall device 2 and the third Hall device 3.

The Hall device biasing circuit 300 further includes a constant voltage supply section 380. The constant voltage supply section 380 includes a first correction current supply section 355, a second correction current supply section 360, and a third correction current supply section 365. The first correction current supply section 355 includes a first reference voltage source 322 and a first buffer amplifier 314. The second correction current supply section 360 includes a second reference voltage source 323 and a second buffer amplifier 315. The third correction current supply section 365 includes a third reference voltage source 324 and a third buffer amplifier 316. Among the reference voltage sources 322 through 324, the first reference voltage source 322 provides the highest voltage level, the second voltage source 323 provides the next highest voltage level, and the third reference voltage source 324 provides the lowest voltage level.

Output terminals of the reference voltage sources 322, 323 and 324 are respectively connected to negative terminals of the buffer amplifiers 314, 315 and 316. The first, second and third terminals 4, 5 and 6 are connected to positive terminals of the first through third buffer amplifiers 314, 315 and 316. In the third example, the buffer amplifiers are used as comparator circuits of a comparison section corresponding to the comparison sections 210a and 210b of the Hall device biasing circuit 200 in FIG. 2.

An output terminal of the first buffer amplifier 314 is connected to a gate of a P-channel MOS transistor 317. A source of the P-channel MOS transistor 317 is connected to a supply voltage $V_{CC}$. A drain of the P-channel MOS transistor 317 is connected to the first terminal 4. The supply voltage $V_{CC}$ can be provided inside or outside the Hall device biasing circuit 300.

An output terminal of the second buffer amplifier 315 is connected to a gate of a P-channel MOS transistor 318 and also to a gate of an N-channel MOS transistor 319. A source of the P-channel MOS transistor 318 is connected to the first terminal 4. A drain of the P-channel MOS transistor 318 is connected to the second terminal 5 and also to a drain of the N-channel MOS transistor 319. A source of the N-channel MOS transistor 319 is connected to the third terminal 6.

An output terminal of the third buffer amplifier 316 is connected to a gate of a P-channel MOS transistor 320 and also to a gate of an N-channel MOS transistor 321. A source of the P-channel MOS transistor 320 is connected to the second terminal 5. A drain of the P-channel MOS transistor 320 is connected to the third terminal 6 and also to a drain of the N-channel MOS transistor 321. A source of the N-channel MOS transistor 321 is connected to the ground terminal 13. The P-channel MOS transistors 317, 318 and 320 and the N-channel MOS transistors 319 and 321 act as current paths.

The correspondence of the elements in FIGS. 2 and 3 will be described. The reference voltage source 322, the first buffer amplifier 314 and the P-channel MOS transistor 317 in FIG. 3 correspond to the constant voltage supply circuit 207 in FIG. 2. The second reference voltage source 323 (FIG. 3) corresponds to the constant voltage generation circuit 208a (FIG. 2). The second buffer amplifier 315 (FIG. 3) corresponds to the first comparison section 210a (FIG. 2). The P-channel MOS transistor 318, and the N-channel MOS transistor 319 (FIG. 3) respectively correspond to the current paths 212a and 212b (FIG. 2). Similarly, the reference voltage source 324 (FIG. 3) corresponds to the constant voltage generation circuit 208b (FIG. 2). The third buffer amplifier 316 (FIG. 3) corresponds to the second comparison section 210b (FIG. 2). The P-channel MOS transistor 320, and the N-channel MOS transistor 321 (FIG. 3) respectively correspond to the current paths 212c and 212d (FIG. 2). As described above, switching devices such as, for example, MOS transistors can be used as the current paths.

The Hall device biasing circuit 300 having the above-described structure operates, for example, as follows.

The negative terminal of the first buffer amplifier 314 is supplied with an output voltage from the reference voltage source 322 as a reference voltage, and the positive terminal of the first buffer amplifier 314 is supplied with a voltage of the first terminal 4 which has been fed back. When the voltage of the first terminal 4 becomes lower than the output voltage from the reference voltage source 322, the output of the first buffer amplifier 314 is lowered, and the voltage level of the gate of the P-channel MOS transistor 317 is also lowered, the gate being connected to the first buffer amplifier 314. Thus, the current flowing in the P-channel MOS transistor 317 is increased and the voltage level of the first terminal 4 is raised.

When the voltage of the first terminal 4 is raised to the voltage of the reference voltage source 322, the output of the first buffer amplifier 314 is raised, and the voltage level of the gate of the P-channel MOS transistor 317 is also raised. Thus, the voltage level of the terminal 4 is lowered. As a result, the voltage level of the first terminal 4 is maintained at the output voltage level of the reference voltage source 322.

Similarly, the positive terminal of the second buffer amplifier 315 is supplied with a voltage of the second terminal 5 which has been fed back, and the P-channel MOS transistor 318 acts so as to maintain the voltage level of the second terminal 5 at the output voltage level of the second reference voltage source 323 as described below.

When the voltage of the second terminal 5 becomes lower than the output voltage from the second reference voltage source 323, the output of the second buffer amplifier 315 is lowered, and the voltage level of the gate of the P-channel MOS transistor 318 is also lowered. Thus, the current flowing in the P-channel MOS transistor 318 is increased and the voltage level of the second terminal 5 is raised. When the voltage of the second terminal 5 is raised to the voltage of the second reference voltage source 323, the output of the second buffer amplifier 315 is raised, and the voltage level of the gate of the P-channel MOS transistor 318 is also raised. Thus, the voltage level of the second terminal 5 is lowered. As a result, the voltage level of the second terminal 5 is maintained at the output voltage level of the second reference voltage source 323.

The output of the second buffer amplifier 315 is supplied to the gate of the N-channel MOS transistor 319. When the voltage level of the second terminal 5 is raised, the output level of the second buffer amplifier 315 is raised. Thus, the voltage level of the gate of the N-channel MOS transistor 319 is raised, and the current passing through the drain of the N-channel MOS transistor 319 is increased. As a result, the current in the second terminal 5 flows through the N-channel MOS transistor 319, and thus the output level of the second terminal 5 is lowered. When the output level of the second terminal 5 is lowered down to the voltage level of the second reference voltage source 323, the N-channel MOS transistor 319 is turned off, and the voltage level of the second terminal 5 is maintained at the voltage level of the second reference voltage source 323.

Similarly, the voltage level of the third terminal 6 is also maintained at the voltage level of the third reference voltage source 324 by turning on or off the P-channel MOS transistor 320 and the N-channel MOS transistor 321 based on the output of the third buffer amplifier 316.

All the Hall devices 1 through 3 are driven by a current $I_{o1}$ supplied from the first terminal 4, and the voltage level of the first terminal 4 is maintained at the voltage level of the first reference voltage source 322. The voltage level of the second terminal 5 is maintained at a constant level by the P-channel MOS transistor 318 and the N-channel MOS transistor 319. When the current is insufficient at the second terminal 5, a current $I_{i1}$ from the first terminal 4 is supplied to the second terminal 5 as a bias correction current $I_{o2}$. When the current is excessive at the second terminal 5, the bias correction current $I_{i2}$ is output from the second terminal 5. Similarly, the voltage level of the third terminal 6 is maintained at a constant level by the P-channel MOS transistor 320 and the N-channel MOS transistor 321.

As described above, the voltage level of each of the second terminal 5 and the third terminal 6 can be adjusted by a simple circuit configuration obtaining by combining a pair of transistors and a buffer amplifier supplied with a reference voltage by a reference voltage source. The circuit can be easily designed.

In the above structure, the current passing through one output terminal (terminals 4, 5 or 6) is adjusted by two transistors. As can be appreciated from the above, there is no undesirable possibility that the transistor will operate simultaneously to cause a shoot-through current to flow and thus to increase the current consumption.

In the above structure, MOS transistors are used. A similar effect is obtained by a bipolar circuit including a PNP transistor instead of the P-channel MOS transistor and an NPN transistor instead of the N-channel MOS transistor.

Figure 4:
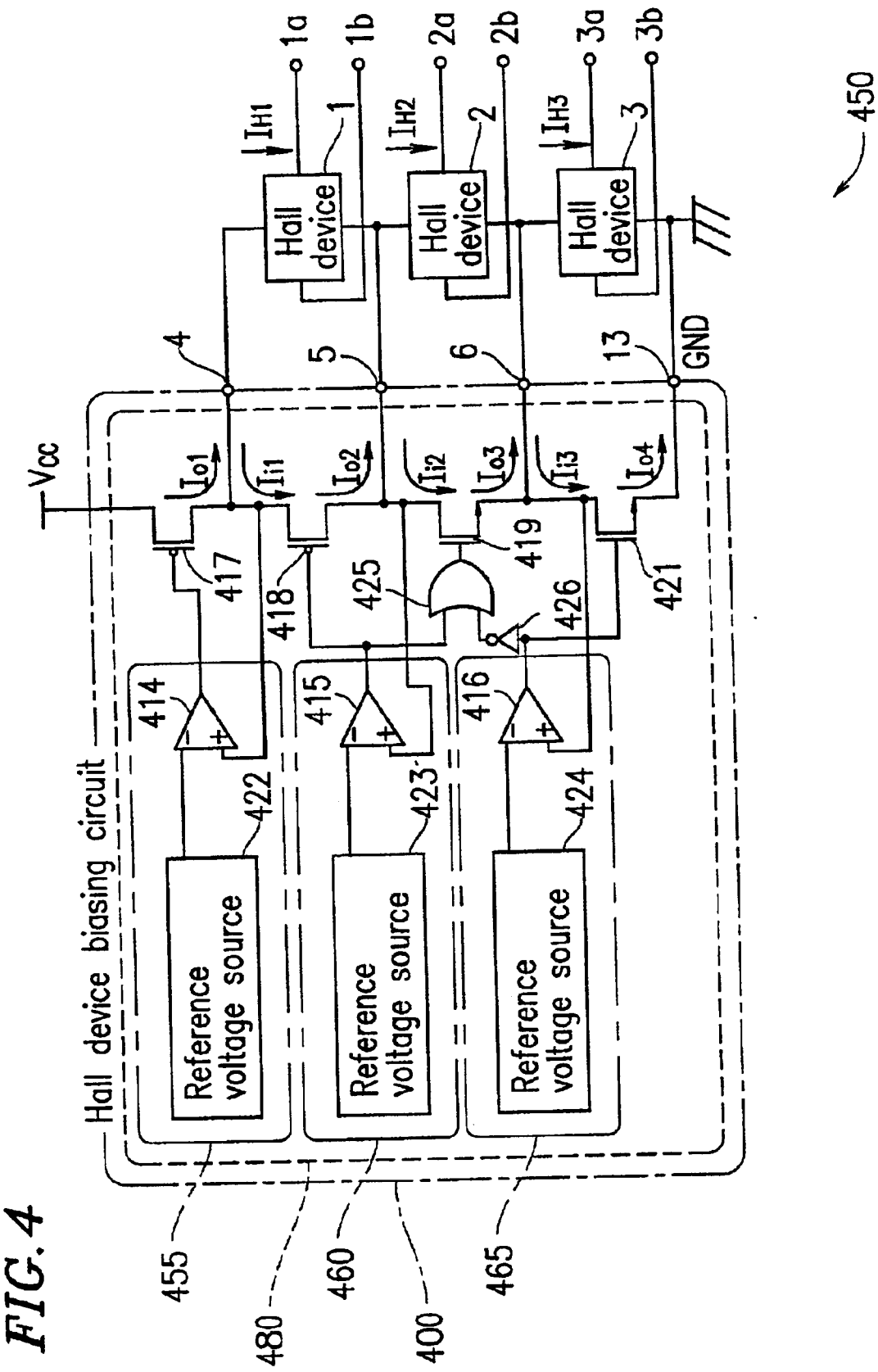
FIG. 4 is a block diagram illustrating a Hall device biasing circuit in a modification of the example shown in FIG. 3.

FIG. 4 is a block diagram of a Hall device biasing circuit 400 and a magnetism detection circuit 450 in a modification of the third example according to the present invention.

In the Hall device biasing circuit 300 shown in FIG. 3, the N-channel MOS transistor 319 and the P-channel MOS transistor 320 are provided on one current path between the second terminal 5 and the third terminal 6. In the Hall device biasing circuit 400 shown in FIG. 4, one N-channel MOS transistor 419 can be provided on the current path between the second terminal 5 and the third terminal 6. In this structure, an output signal from a second buffer amplifier 415 and a signal obtained by inverting an output signal from a third buffer amplifier 416 by an inverter 426 are synthesized by an OR (logical sum) circuit 425, and the output from the OR circuit 425 is output to a gate of the N-channel MOS transistor 419 as a control signal, so that the current path between the terminals 5 and 6 is turned on and off by the N-channel MOS transistor 419. Thus, the Hall device biasing circuit 400 in FIG. 4 achieves a similar effect to that of the Hall device biasing circuit 300 in FIG. 3. The OR circuit 425 and the inverter 426 act as a current path.

In this case, an N-channel MOS transistor (not shown) can be provided on a current path between the second terminal 5 and the third terminal 6, so that the output signal from the second buffer amplifier 415 is inverted by an inverter and output to the OR circuit 425 and also the output signal from the third buffer amplifier 416 is directly input to the OR circuit 425.

Such a structure is also applicable even when a large number of current paths are required to drive a large number of Hall devices. In this manner, the Hall device biasing circuit can be reduced in size since the number of transistors, for the current path, which need a large space can be reduced.

EXAMPLE 4

Figure 5:
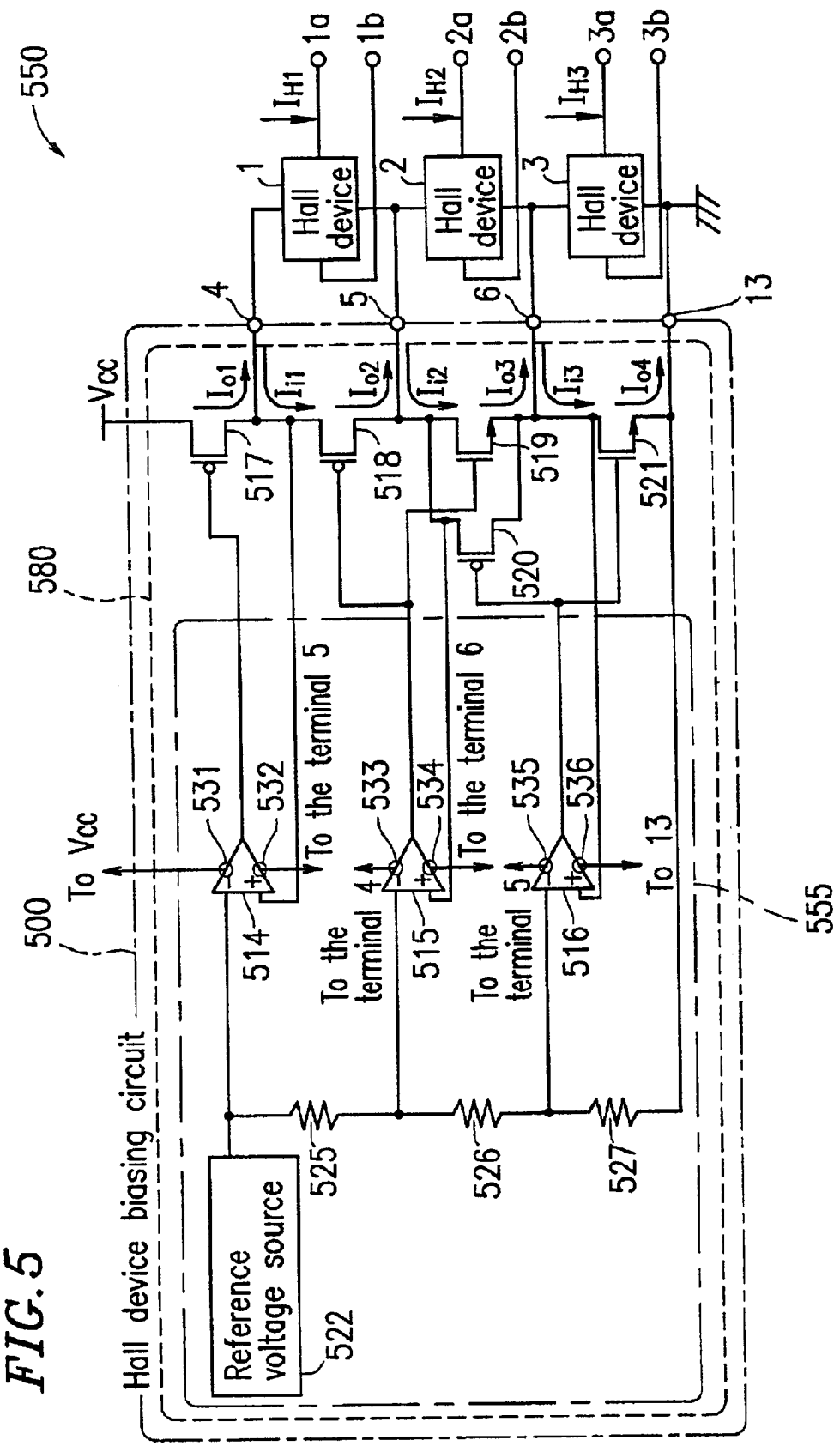
FIG. 5 is a block diagram illustrating a Hall device biasing circuit in s till an other example according to the present invention.
Figure 6:
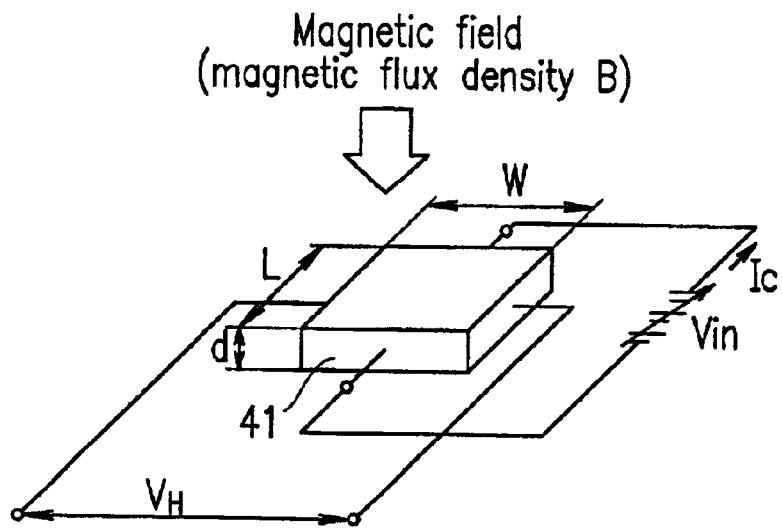
FIG. 6 illustrates the operating principle of a Hall device.
Figure 7:
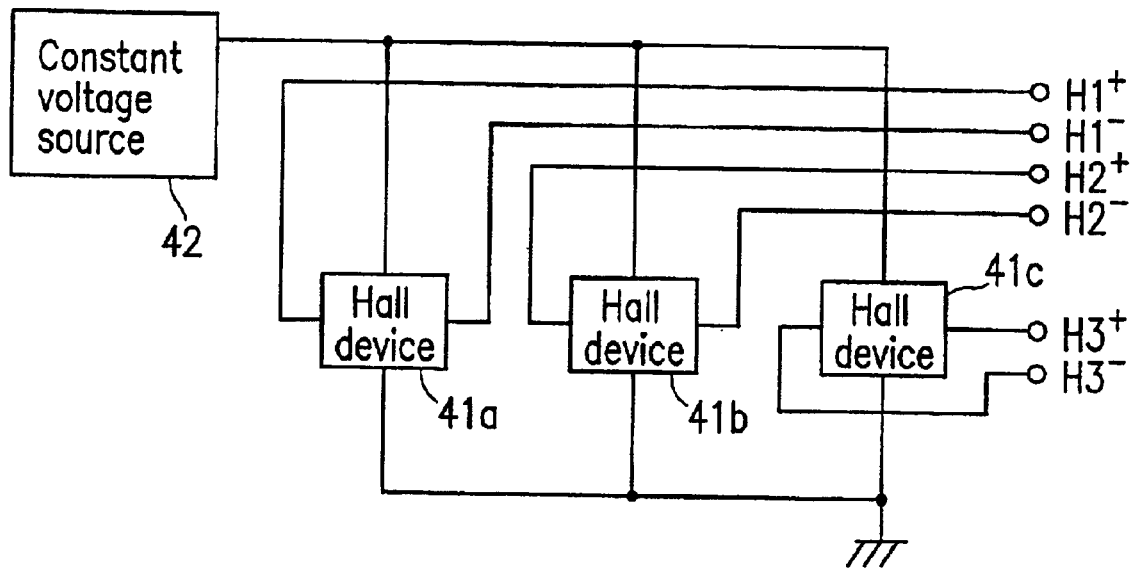
FIG. 7 is a block diagram illustrating a conventional Hall device biasing circuit.
Figure 8:
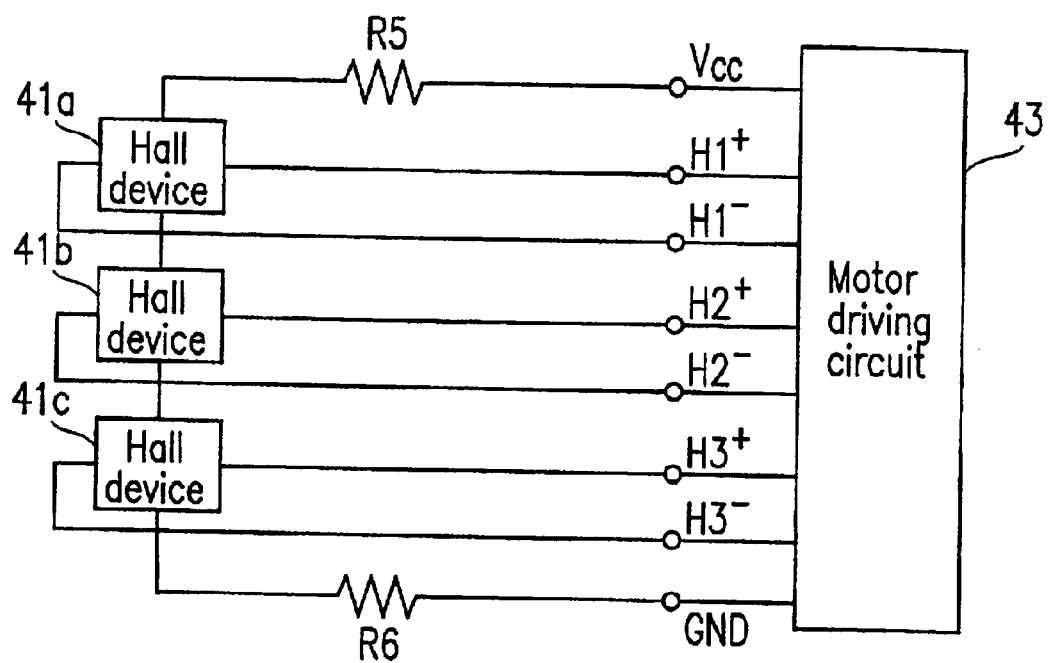
FIG. 8 is a block diagram illustrating another conventional Hall device biasing circuit.

FIG. 5 is a block diagram of a Hall device biasing circuit 500 and a magnetism detection circuit 550 in a fourth example according to the present invention. The Hall device biasing circuit 500 includes a constant voltage supply section 580. The constant voltage supply section 580 includes a correction current supply section 555. The correction current supply section 555 includes one reference voltage source 522 and three resistors 525, 526 and 527 connected in series, instead of the three reference voltage sources 322, 323 and 324 in the Hall device biasing circuit 300 (FIG. 3). The correction current supply section 555 further includes first, second and third buffer amplifiers 514, 515 and 516. The voltage of the reference voltage source 522 is divided by the resistors 525, 526 and 527, and the divided voltages are respectively supplied to negative terminals of the buffer amplifiers 514, 515 and 516 as reference voltages. Due to such a structure, even when the number of Hall devices is increased, it is not necessary to prepare an equal number of reference voltage sources to the number of the Hall devices. Thus, enlargement of the circuit scale and increase in the current consumption can be suppressed. Positive terminals of the buffer amplifiers 514, 515 and 516 are respectively connected to the terminals 4, 5 and 6. Therefore, the terminals 4 through 6 are respectively supplied with a voltage in the vicinity of the reference voltage supplied to the corresponding buffer amplifiers 514, 515 and 516.

As a supply voltage for the buffer amplifiers 514, 515 and 516, the voltage between the supply voltage $V_{CC}$ and the ground is not necessary. As a supply voltage for the first buffer amplifier 514, a voltage between the supply voltage $V_{CC}$ and the second terminal 5 is applied. As a supply voltage for the second buffer amplifier 515, a voltage between the second terminal 5 and the third terminal 6 is applied. As a supply voltage for the third buffer amplifier 516, a voltage between the third terminal 6 and a ground terminal 13 is applied.

That is, a former-stage terminal with respect to a terminal corresponding to a buffer amplifier is connected to a positive power supply terminal of the buffer amplifier, and a latter-stage terminal with respect to the terminal corresponding to the buffer amplifier is connected to a negative power supply terminal of the buffer amplifier. Specifically, in FIG. 5, a positive power supply terminal 531 of the first buffer amplifier 514 corresponding to a terminal 4 is connected to the supply voltage $V_{CC}$, and a negative power supply terminal 532 of the first buffer amplifier 514 is connected to a second terminal 5. Here, the supply voltage $V_{CC}$ corresponds to the former-stage terminal with respect to the first terminal 4. A positive power supply terminal 533 of the second buffer amplifier 515 corresponding to the second terminal 5 is connected to the first terminal 4, and a negative power supply terminal 534 of the second buffer amplifier 515 is connected to a third terminal 6. A positive power supply terminal 535 of the third buffer amplifier 516 is connected to the second terminal 5, and a negative power supply terminal 536 of the third buffer amplifier 516 is connected to the ground terminal 13.

Accordingly, the current consumption in the buffer amplifiers 514, 515 and 516 can be reduced. Such a structure is applicable even when a large number of buffer amplifiers are required to drive a large number of Hall devices.

As described above, a Hall device biasing circuit according to the present invention includes a plurality of output terminals respectively for driving a plurality of Hall devices connected in series at a constant voltage. Since each of the Hall devices can be driven at a constant voltage, even when the number of Hall devices increases, the total driving current required to drive all the Hall devices can be prevented from increasing. Moreover, each Hall device operates with satisfactory temperature characteristics.

In the case where a current path is provided between output terminals, the total current consumption of all the Hall devices can be further reduced. Regardless of the number of Hall devices, the consumed current is the current consumed only by the device consuming the highest amount of current among all the Hall devices. Accordingly, no problem arises even when the driving currents for the Hall devices are different from one another.

When buffer amplifiers are used to maintain the constant voltage, the current consumption in each buffer amplifier can be suppressed by connecting the power supply terminals thereof in series in the order of voltage level. The current consumption does not rely on the number of buffer amplifiers used.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A Hall device biasing circuit, comprising a plurality of terminals for applying a bias voltage to a plurality of Hall devices connected in series, respectively, so that a driving current driving at least one Hall device of the plurality of Hall devices is a current adjusted amount of a driving current driving another Hall device through a corresponding terminal of the plurality of terminals, and so that the bias voltage applied to each of the plurality of Hall devices is substantially constant.

2. A Hall device biasing circuit according to claim 1, further comprising a constant voltage supply section for supplying a constant bias voltage to each of the plurality of terminals.

3. A Hall device biasing circuit according to claim 2, wherein the constant voltage supply section includes a constant voltage supply circuit in correspondence to the plurality of Hall devices.

4. A Hall device biasing circuit according to claim 2, wherein the constant voltage supply section includes:
   a constant voltage supply circuit,
   at least one current path through which a bias correction current flows from one of the plurality of terminals to another of the plurality of terminals, and
   a correction current supply section for selecting one of the at least one current path based on a current amount therein and adjusting the current amount in the selected current path to supply the bias correction current.

5. A Hall device biasing circuit according to claim 4, wherein the correction current supply section includes:
   a constant voltage generation circuit, and
   a comparison section connected to the at least one current path for selecting one of the at least one current path based on a current amount therein and adjusting the current amount in the selected current path based on a current amount flowing through the at least one current path and a current amount generated in the constant voltage generation circuit.

6. A Hall device biasing circuit according to claim 2, wherein the constant voltage supply section uses a supply voltage outside the Hall device biasing circuit.

7. A Hall device biasing circuit according to claim 2, wherein the constant voltage supply section includes:
   at least one current path through which a bias correction current flows from one of the plurality of terminals to another of the plurality of terminals, and
   a correction current supply section for selecting one of the at least one current path based on a current amount therein and adjusting the current amount in the selected current path to supply the bias correction current.

8. A Hall device biasing circuit according to claim 7, wherein the at least one current path includes a switching device.

9. A Hall device biasing circuit according to claim 7, wherein the at least one current path includes an OR circuit and an inverter.

10. A Hall device biasing circuit according to claim 7, wherein the correction current supply section includes:
- a plurality of reference voltage sources respectively provided in correspondence to the plurality of Hall devices, and
- a plurality of comparison sections each connected to each of the at least one current path for selecting one of the at least one current path based on a current amount therein and adjusting the current amount in the selected current path based on a current amount flowing through one of the plurality of terminals and a current amount generated in one of the plurality of reference voltage sources corresponding to the one of the plurality of terminals.

11. A Hall device biasing circuit according to claim 7, wherein the correction current supply section includes:
- a reference voltage source, and
- a comparison section connected to the at least one current path for selecting one of the at least one current path based on a current amount therein and adjusting the current amount in the selected current path based on a current amount flowing through one of the plurality of terminals and a current amount generated in the reference voltage source.

12. A Hall device biasing circuit according to claim 11, wherein the correction current supply section further includes a resistor between the reference voltage source and the comparison section for dividing a resistance of the reference voltage source.

13. A Hall device biasing circuit according to claim 11, wherein the comparison section includes a comparator circuit.

14. A Hall device biasing circuit according to claim 13, wherein a positive terminal of the comparator circuit is connected to a terminal of one of the plurality of terminals, and the negative terminal of the comparator circuit is supplied with a reference voltage generated in the reference voltage source.

15. A Hall device biasing circuit according to claim 13, wherein the comparator circuit includes a buffer amplifier.

16. A Hall device biasing circuit according to claim 15, wherein a former-stage terminal with respect to one of the plurality of terminals corresponding to the buffer amplifier is connected to a positive power supply of the buffer amplifier, and a latter-stage terminal with respect to the one of the plurality of terminals corresponding to the buffer amplifier is connected to a negative power supply of the buffer amplifier.

17. A Hall device biasing circuit according to claim 1, wherein said plurality of terminals apply said bias voltage in parallel to said plurality of Hall devices connected in series.

18. A magnetism detection circuit, comprising:
- a plurality of Hall devices connected in series; and
- a Hall device biasing circuit including at least a plurality of terminals corresponding to the plurality of Hall devices for supplying a constant bias voltage to each of the plurality of Hall devices respectively from the plurality of terminals so that a driving current driving at least one Hall device of the plurality of Hall devices is a current adjusted amount of a driving current driving another Hall device through a corresponding terminal of the plurality of terminals, and so that the bias voltage applied to each of the plurality of Hall devices is substantially constant.

19. A magnetism detection circuit according to claim 18, wherein the Hall device biasing circuit further includes a constant voltage supply section.

20. A magnetism detection circuit according to claim 18, wherein one end of the series of plurality of Hall devices is grounded.

* * * * *